US006943100B2

(12) United States Patent
Chinda et al.

(10) Patent No.: US 6,943,100 B2
(45) Date of Patent: Sep. 13, 2005

(54) METHOD OF FABRICATING A WIRING BOARD UTILIZING A CONDUCTIVE MEMBER HAVING A REDUCED THICKNESS

(75) Inventors: Akira Chinda, Ibaraki (JP); Akira Matsuura, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 10/684,423

(22) Filed: Oct. 15, 2003

(65) Prior Publication Data

US 2004/0080054 A1 Apr. 29, 2004

Related U.S. Application Data

(62) Division of application No. 10/021,257, filed on Dec. 19, 2001, now Pat. No. 6,670,718.

(30) Foreign Application Priority Data

Dec. 19, 2000 (JP) ....................................... 2000-389958

(51) Int. Cl.[7] ......................... H01L 21/48; H01L 23/48; H01R 43/16

(52) U.S. Cl. ......................... 438/612; 438/614; 29/874; 257/774; 257/775; 257/781

(58) Field of Search .......................... 29/825, 829, 874; 438/127, 584, 597, 611–615, 106, 620; 257/680, 687, 678, 690, 734, 784, 773–775, 737, 738, 779, 780, 781, 787; 361/600, 679, 748, 760, 772–774

(56) References Cited

U.S. PATENT DOCUMENTS

| | | | | |
|---|---|---|---|---|
| 3,471,631 A | | 10/1969 | Quintana | |
| 5,260,518 A | | 11/1993 | Tanaka et al. | |
| 6,005,198 A | | 12/1999 | Gregoire | |
| 6,180,505 B1 | | 1/2001 | Uzoh | |
| 6,362,436 B1 | | 3/2002 | Kimbara et al. | |
| 6,670,718 B2 | * | 12/2003 | Chinda et al. | 257/774 |

FOREIGN PATENT DOCUMENTS

JP 2000-4069 A 1/2000

OTHER PUBLICATIONS

Masanori Mizoguchi et al., "Circuit Board", Patent Abstracts of Japan, Pub. No. 09–017828, Jan. 17, 1997.

* cited by examiner

*Primary Examiner*—Alonzo Chambliss
(74) *Attorney, Agent, or Firm*—Foley & Lardner LLP

(57) ABSTRACT

In a writing board wherein an opening is defined at a predetermined position of a film-like insulating substrate, an electric wiring provided with a connection terminal covering the opening is disposed on a principle plane of the insulating substrate, and a conductive member to be connected with the connection terminal of the electric wiring is disposed inside the opening; the conductive member having a thickness from a surface on which the electric wiring of the insulating substrate has been disposed is thinner than that of the insulating substrate.

5 Claims, 18 Drawing Sheets

METHOD OF FABRICATING A WIRING BOARD UTILIZING A CONDUCTIVE MEMBER HAVING A REDUCED THICKNESS

The present application is a divisional of U.S. application Ser. No. 10/021,257, filed Dec. 19, 2001 now U.S. Pat. No. 6,670,718, the entire contents of which are incorporated herein by reference.

BACKGROUND OF THE INVENTION

1. Field of the Invention

The present invention relates to a wiring board, a semiconductor device, and a process for the production of wiring boards, and particularly to an effective technology applied to a semiconductor device of LGA (Land Grid Array) type.

2. Prior Art

Heretofore, there has been semiconductor device of CSP (Chip Scale Package) type wherein a ball-like bump (ball terminal) is connected as an external connection terminal for connecting the semiconductor device to a mount board such as a mother board, or an external device as the one wherein a semiconductor chip has been mounted on a wiring board.

The above-described semiconductor device of CSP type is arranged as shown in, for example, FIGS. 1A and 1B, in such that a wiring board in which an electric wiring 2 and an external connection terminal 2A are disposed on a first principle plane (a side of the front) of an insulating substrate 1 such as a polyimide tape is placed, and a semiconductor chip 6 is mounted on the surface on which the electric wiring 2 of the wiring board (the insulating substrate 1) has been formed in, for example, such a manner that its external electrode 601 is opposed to the above-described surface wherein the electric wiring 2 of the above-described wiring board is connected with the external electrode 601 through a protrusion conductor 13. FIG. 1B is a sectional view taken along the line C–C' of FIG. 1A. Further, a gap between the wiring board (insulating substrate 1) and the semiconductor chip 6 is subjected to under-filling sealing by means of a sealing insulator 9 made of, for example, an epoxy-based thermosetting resin and the like in the above-described semiconductor device. Besides, an opening 101 for connecting a ball terminal is defined at a predetermined position of the insulating substrate 1, for example, a site where, for example, the external connecting terminal 2 has been disposed, and it is guided to a second principal plane opposed to the first principal plane by means of a through hole plating 15 provided around the opening 101 or a conductive member filled inside the opening 101. To the opening 101, a ball terminal 16 made of, for example, a Pb—Sn based solder and the like is connected.

In case of the above-described semiconductor device of CSP type, however, when the ball terminal 16 of the semiconductor device of CSP type is connected with an electric wiring 11 of a mount board 10 such as a mother board to mount the semiconductor as shown in FIG. 2, a height t extending from a mounting surface 10A of the above-described mount board 10 to the upper surface 6A of the semiconductor chip 6 in the semiconductor device becomes higher by an amount corresponding to a height t' of the above-described ball terminal 16. For this reason, a container (casing) for containing the amount board 10 on which the above-described semiconductor device of CSP type has been mounted becomes thicker, so that it is difficult to reduce a size of the semiconductor device.

Moreover, since the external electrode 601 of the above-described semiconductor chip 6 is connected with the electric wiring 2 by means of the protrusion conductor 13 in the case when the semiconductor chip 6 is subjected to flip-chip junction on the wiring board, a distance (stand-off) extending from the insulating substrate 1 to a circuit-forming surface of the semiconductor chip 6 becomes higher, so that the semiconductor device becomes thicker, whereby it is difficult to thicken the same.

In this connection, there is a semiconductor to LGA type wherein an unrelieved external connecting terminal is disposed in place of the above-described ball terminal 16 as a manner for preventing from an appearance of a thicker semiconductor device. In the above-described ball terminal 16 as a manner for preventing from an appearance of a thicker semiconductor device. In the above-described semiconductor device of LGA type, an electric wiring 2 is formed on a principal plane of an insulating substrate 1, and an external connecting terminal (land) 17 is formed on a surface opposed to the surface on which the electric wiring of the above-described insulating substrate 1 has been formed as shown in FIG. 3. In this case, the electric wiring 2 is electrically connected with the land 17 by means of a through-hole plating 15 provided around a via hole 102 defined on the above-described insulating substrate 1. The outer periphery of the land 17 may be covered with a protective film such as a solder resist. In case of the above-described semiconductor device of LGA type, a plating layer 4B prepared by laminating a nickel plating layer and a gold plating layer having good solderability on a surface of the land 17. In this respect, a soldering paste or the like has been previously applied onto a predetermined position of the surface of the above-described land 17 or the electric wiring 11 on a mount board 10, and then, the semiconductor device is mounted.

In case of such a semiconductor device of LGA type, since there is no ball terminal 16 as in a semiconductor device of CSP type, a height of the semiconductor device can be reduced in the case when it is mounted on the mount board 10, whereby the present semiconductor device can be made thinner than that of the above-described semiconductor device of CSP type.

A wiring board used in the above-described semiconductor device of LGA type is prepared as described hereinafter. First, conductive thin films 18 made of a copper foil and the like are formed both principal planes of an insulating substrate made of a polyimide tape and the like, the conductive thin film on a side of either principal plane is etched to form an external connection terminal 17, and then, a via hole 102 is defined at a predetermined position of the above-described external connection terminal 17 by means of laser or the like as shown in FIG. 4A.

Thereafter, a through-hole plating 15 is formed around the via hole 102 as shown in FIG. 4B, and an electric wiring 2 is formed from the conductive thin film 18 on the surface opposed to that on which the above-described external connection terminal 17 has been formed by the use of, for example, an additive plating method or the like method. In this occasion, a connection terminal 2A, which is to be connected to a through-hole plating 15 in the above described via hole 102, is formed on the electric wiring 2.

Then, as shown in FIG. 4C, a plating layer 4A prepared by laminating, for example, a nickel plating layer and a gold plating layer is formed on a surface of the above-described electric wiring 2 as well as a plating layer 4B prepared by laminating, for example, a nickel plating layer and a gold plating layer is formed on a surface of the above-described external connection terminal 17. A wiring board used for a semiconductor device of LGA type is obtained in accordance with the procedure as described above.

For instance, a semiconductor chip 6 is subjected to flip-chip mounting on a surface on which the electric wiring 2 of a wiring board prepared in accordance with the above-described procedure has been formed, and a liquid resin is poured in between the above-described wiring board (insulating substrate 1) and the semiconductor chip 6 to complete under-filling sealing, whereby a semiconductor device of LGA type can be obtained as shown in FIG. 3.

In a semiconductor device of CSP type shown in FIG. 1, however, it is required to maintain certain spacing in between the openings 101 so as not to be in contact with the ball terminals 16 each other. The same situation is observed in also the semiconductor device of LGA type shown in FIG. 3 wherein it is required to maintain a certain spacing in between the via holes 102 so as not to be in contact with the external connection terminals (lands) 17 each other. In this respect, via holes 102 must be formed with a certain spacing from a constructional point of view in case of any of the semiconductor devices above, otherwise it results in a drawback for downsizing of its package.

Furthermore, in a conventional semiconductor device of LGA type described above, the electric wiring 2 is formed on a principal plane of the insulating substrate 1, and the external connection terminal (land) 17 is formed on the surface opposed to that on which the electric wiring has been formed in case of preparing a wiring board for mounting a semiconductor chip. In this constitution, a tape material wherein a conductive thin film such as a copper foil has been disposed on the opposite surface of the insulating substrate 1 is employed. For this reason, there has been such a problem that its material cost increases, besides its manufacturing steps increase, so that the resulting manufactures' costs for wiring board and semiconductor device increase.

SUMMARY OF THE INVENTION

Accordingly, an object of the present invention is to provide a technology by which a semiconductor device wherein a semiconductor chip has been mounted on its mounting board can be thinned.

Another object of the present invention is to provide a technology by which a height extending from a mount board to the top surface of its semiconductor device can be reduced in the case when the semiconductor device wherein a semiconductor chip has been mounted on its wiring board is mounted on the mount board.

A further object of the present invention is to provide a technology by which manufacturing steps for a wiring board used in a semiconductor device of LGA type can be simplified, and its cost of manufacture can be reduced.

The above described and other objects as well as novel features of the present invention will become apparent from the description and the appended drawings of the specification.

(1) In order to achieve the above-described objects, a wiring board according to the present invention wherein an opening is defined at a predetermined position of a film-like insulating substrate, an electric wiring provided with a connection terminal covering the opening is disposed on a principal plane of the insulating substrate, and a conductive member to be connected with the connection terminal of the electric wiring is disposed inside the opening, which comprises the conductive member having a thickness from a surface on which the electric wiring of the insulating substrate has been disposed being thinner than that of the insulating substrate.

According to the above-described wiring board, since the opening is defined on the insulating substrate and the conductive member is formed inside the opening to be connected with the electric wiring, the conductive member may be used as an external connection terminal for connecting the conductive member with an external device, so that it can be used for a wiring board of a semiconductor device of LGA type. In this case, when the thickness of the conductive member is made to be thinner than that of the insulating substrate, projection of an external connection terminal to be connected with an external device from the insulating substrate can be prevented, and the resulting wiring board can be thinned. In this case, however, when the conductive member is too thin, there is a possibility of occurring poor connection, because a soldering paste or the like used in case of connecting the conductive member with an external device is not sufficiently soaked up into the opening. For this reason, it is preferred that a thickness of the conductive member is equal to ½ or more than that of the insulating substrate.

Furthermore, when a thickness of the conductive member is made to be thinner than that of the insulating substrate, it results easily in a cause for poor connection due to remaining air inside the opening in the case when a soldering paste or the like is soaked up into the opening. For the reason, when a concave conductive member having a thinner thickness at the central portion of the opening than that of a vicinity of a side wall of the opening is prepared, air in the opening makes easily away along a curved surface towards the outside, resulting in reduction of occurrence of voids due to remaining air in the opening.

Moreover, the conductive member may be made from copper (Cu), nickel (Ni), silver (Ag) or the like. In this case, it is preferred that a nickel (Ni) thin film layer and a gold (AU) thin film layer are disposed on the surface of the conductive member in order to achieve good bond properties with respect to a solder.

(2) A semiconductor device according to the present invention wherein a wiring board in which an opening is defined at a predetermined position of a film-like insulating substrate, an electric wiring provided with a connection terminal covering the opening is disposed on a principal plane of the insulating substrate, and a conductive member to be connected with the connection terminal of the electric wiring is disposed inside the opening is placed; a semiconductor chip is placed on the surface of the wiring board on which the electric wiring has been disposed; the electric wiring of the wiring board is electrically connected with an external electrode of the semiconductor chip; and the semiconductor chip, the electric wiring, and connecting section for the electric wiring and the external electrode of the semiconductor chip are sealed with a sealing insulator, comprises the conductive member having a thickness from a surface on which the electric wiring of the insulating substrate has been formed being thinner than that of the insulating substrate.

According to the present invention described in the above paragraph (2), when the wiring board described in the above paragraph (1) is employed, such a semiconductor device of LGA type wherein a conductive member disposed in an opening of the insulating substrate is utilized as a connection terminal for an external device can be obtained. Accordingly, there is no case where such a connection terminal for an external device protrudes from the wiring board as in a conventional semiconductor device of BGA type, so that a resulting semiconductor device can be thinned.

The semiconductor device described in the above paragraph (2) may be the one of faceup mounting type wherein the semiconductor chip is placed in such that a surface opposed to the surface on which the external electrode has been formed is opposed to the wiring board, and the external electrode is connected with an electric wiring by means of a bonding wire. Further, the semiconductor device of the above paragraph (2) may be the one of facedown mounting (flip-chip mounting) type wherein the semiconductor chip is placed in such that the external electrode is disposed soasto oppose to the wiring board, and the external electrode is connected with an electric wiring by means of a protrusion conductor.

It is preferred that a thickness of the above-described conductive member is equal to or thinner than that of the above-described insulating substrate so as not to protrude from the insulating substrate. However, when a thickness of the conductive member is too thin, there arises a cause of poor connection in case of connecting an external device. For this reason, it is preferred that a thickness of the conductive member is ½ or more of that of the insulating substrate.

On one hand, in the case where a thickness of the conductive member is made thinner than that of the insulating substrate, for example, a soldering paste, which has been applied to a connection terminal section of an external device, is soaked up in the opening to be connected with the conductive member. In this case, when a surface of the conductive member is flat, air remains in the opening to generate voids, and it results easily in a cause for poor connection. For this reason, when a concaved conductive member having a thinner thickness at the central portion of the opening than that of a vicinity of a sidewall of the opening is disposed, air in the opening makes easily away outside the opening along the curved surface of the conductive member, whereby poor connection due to voids can be reduced.

Moreover, it is preferred that a conductive member be made from any member selected from the group consisting of copper (Cu), nickel (Ni), and silver (Ag). It is also preferred that a thin film layer made of nickel (Ni) and a thin film layer made of gold (Au) are placed on a surface of the conductive member in order to improve bonding properties with respect to a soldering paste.

(3) A process for the production of a wiring board according to the present invention comprises the steps of defining an opening at a predetermined position of a film-like insulating substrate; forming a conductive thin film on a principal plane of the insulating substrate; etching the conductive thin film to form an electric wiring provided with a connection terminal covering the opening; and forming a conductive member having a thickness equal to or thinner than that of the insulating substrate.

According to the process of the invention described in the above paragraph (3), which is to be applied for a production of a wiring board used in a semiconductor device of LGA type, an opening is defined at a predetermined position of the insulating substrate, in other words, a position at which an external connection terminal for connecting an external device is to be formed, a conductive member is formed inside the opening, and the conductive member is used as an external connection terminal, whereby a wiring board used for a semiconductor device of LGA type can be produced by the use of a single-sided wiring tape material wherein a conductive thin film has been formed on a principle plane (either side) of the insulating substrate. For this reason, steps for producing a wiring board used for a semiconductor device of LGA type become simple, besides its material cost can be reduced, so that cost of manufacture for the wiring board can be reduced.

Furthermore, in the process for the production of a wiring board described in the above paragraph (3), when a thin film layer made of nickel (Ni) and a thin film layer made of gold (Au) are sequentially disposed on surfaces of the electric wiring and the conductive member after forming the conductive member, connection reliability of the conductive member and the external device can be improved.

Moreover, in the process of the production of a wiring board described in the above paragraph (3), a step for forming the conductive member may be effected by forming a copper (Cu) plating or a nickel (Ni) plating in accordance with electroplating method, whereby the conductive member can be easily produced. Further, the above-described step for forming the conductive member may be effected by forming a nickel (Ni) plating in accordance with electroless plating method. In addition, a step other than that described above, for example, the one for forming the conductive member may be effected by such a manner that the inside of the opening is filled with a conductive paste of silver (Ag) or copper (Cu), and the conductive paste is solidified.

Besides, the above-described step for forming the conductive member may be affected by such a manner that a concaved conductive member has a thinner thickness at the central portion of the opening than that of a vicinity of a side wall of the opening, whereby connection reliability of the conductive member and a connection terminal of an external device can be elevated. In this case, when the above-described conductive member is formed in accordance with, for example, a plating method, an amount of a leveler to be added to a plating solution for improving evenness of the conductive member (plating layer) is adjusted, so that a concaved plating layer can be formed.

BRIEF DESCRIPTION OF THE DRAWINGS

The present invention will be explained in more detail in conjunction with appended drawings, wherein:

FIGS. 1A, and 1B are schematic views each showing a conventional semiconductor device of CSP type wherein FIG. 1A is a schematic plan view showing the semiconductor device; and FIG. 1B is a schematic sectional view taken along the line C–C' of FIG. 1A;

DESCRIPTION OF THE PREFERRED EMBODIMENTS

Figure 1A:
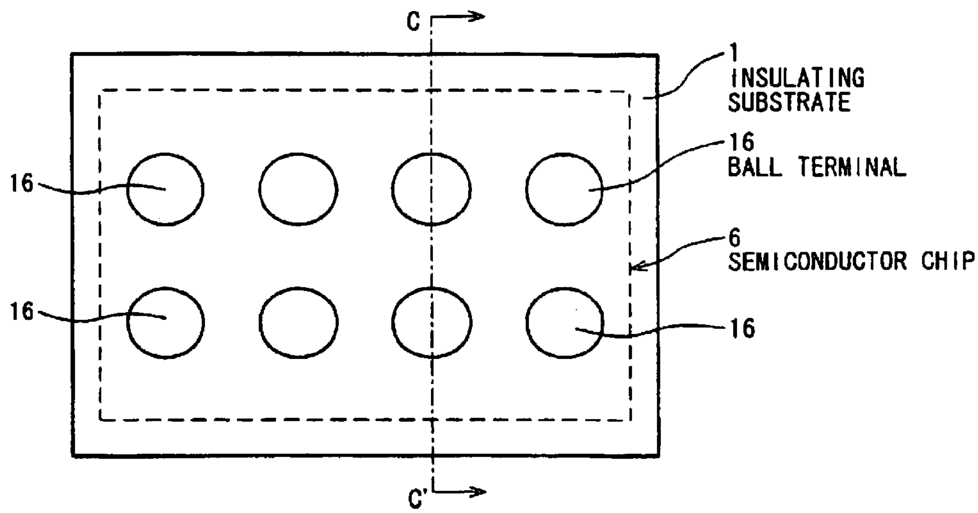
Figure 1B:
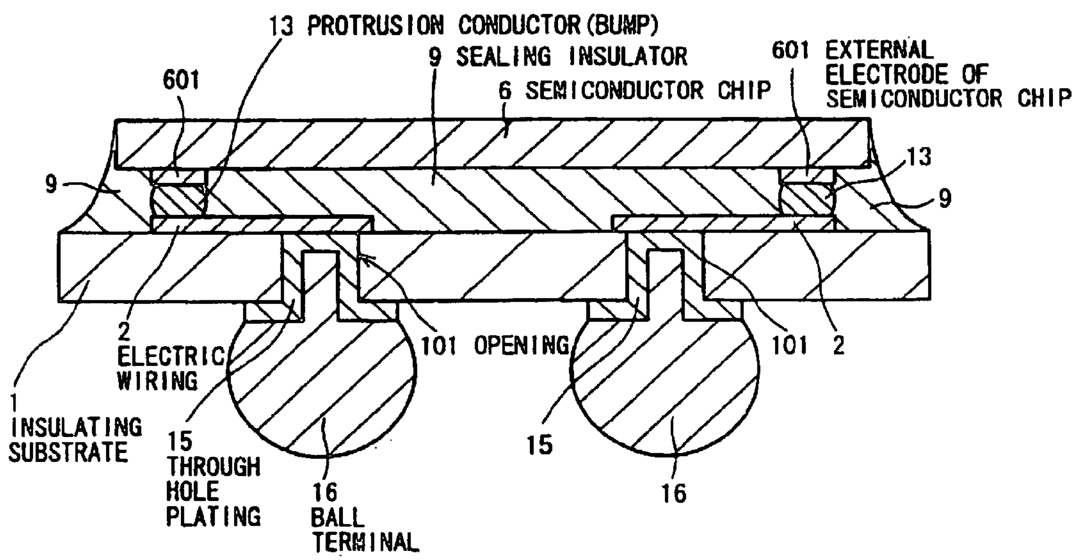
Figure 2:
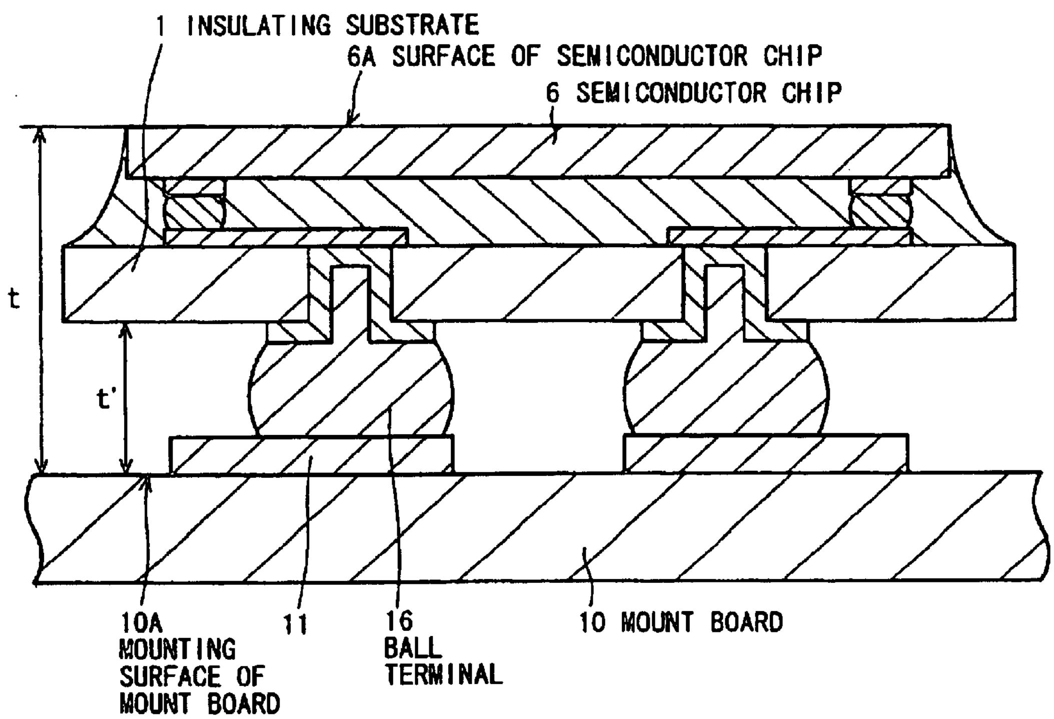
FIG. 2 is a schematic sectional view for explaining a problem of the semiconductor device of CSP type.
Figure 3:
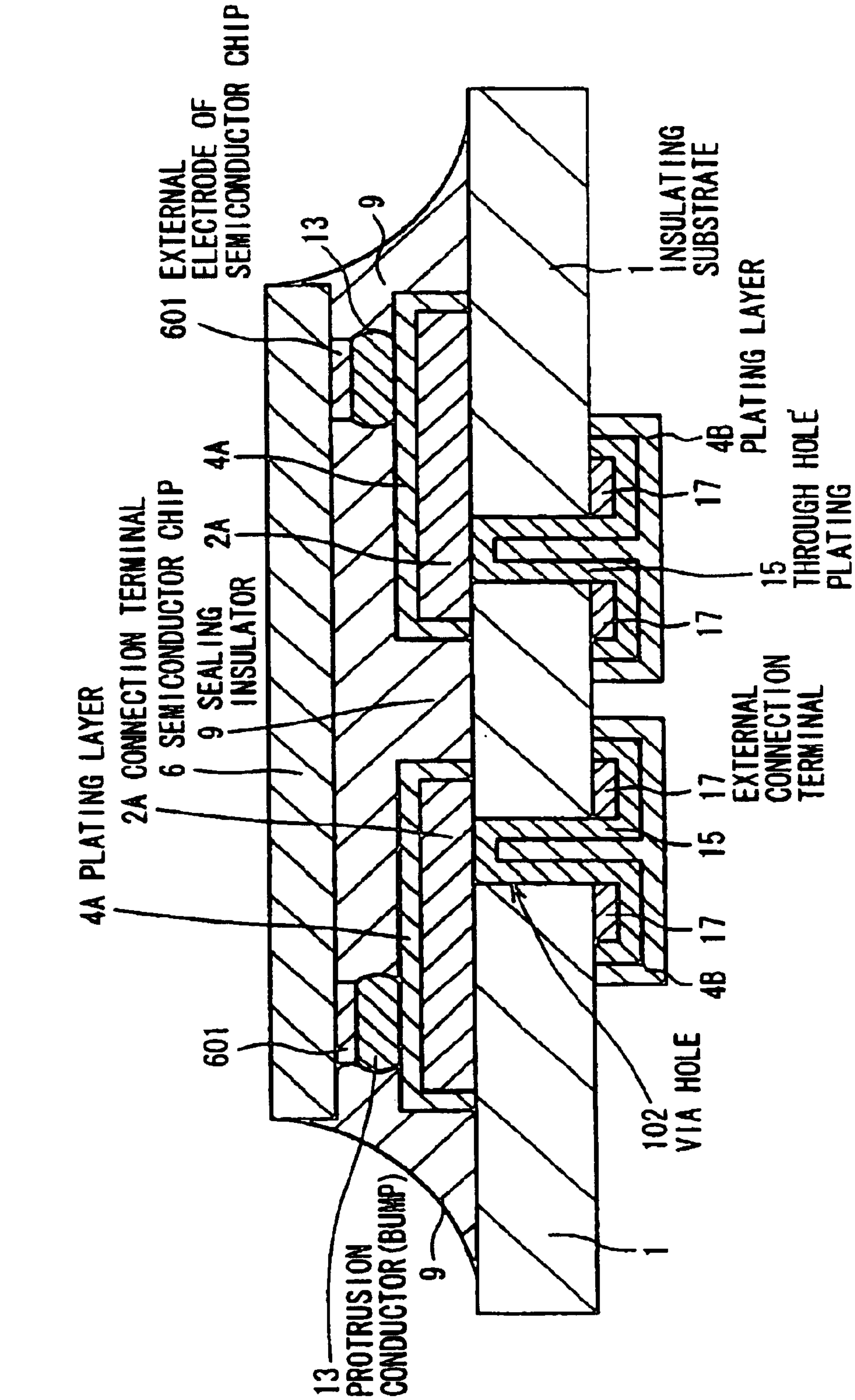
FIG. 3 is a schematic sectional view showing an outlined constitutional of a conventional semiconductor device of LGA type.
Figure 4A:
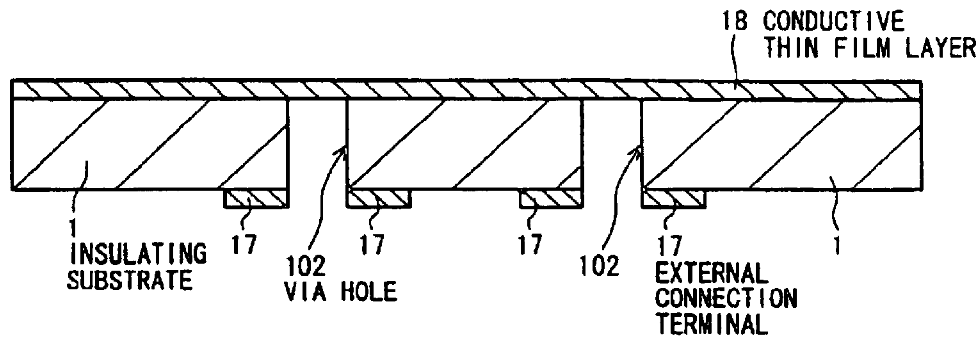
FIGS. 4A, 4B, and 4C are schematic sectional views each for explaining a process for the production of a wiring board used for a conventional semiconductor device of LGA type wherein they are schematic sectional views illustrating respective manufacturing steps of the wiring board.
Figure 4B:
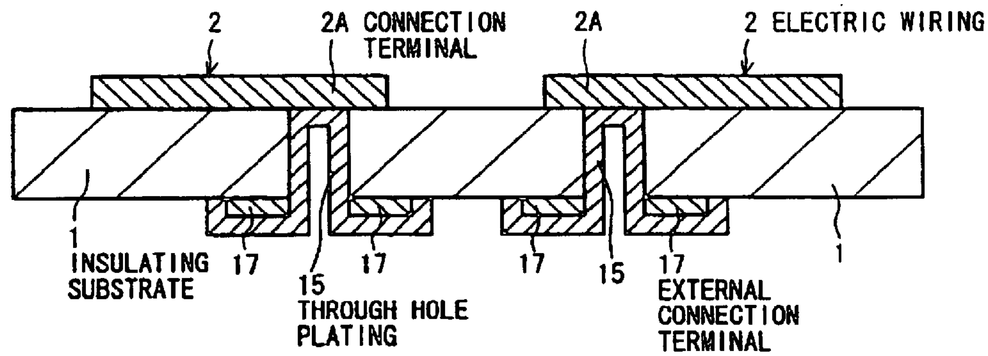
Figure 4C:
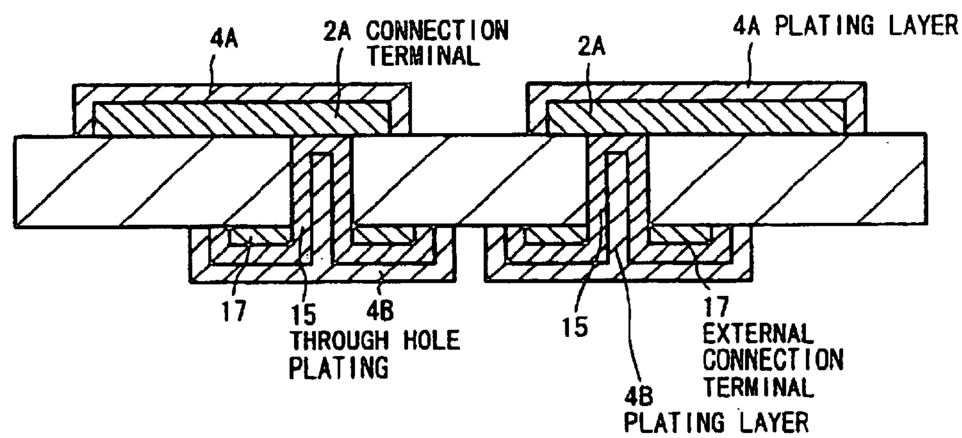

In the following, the present invention will be described in detail together with embodiments (examples) by referring to th accompanying drawings.

It is to be noted herein that components each having the same functions is represented by the same reference character throughout all the drawings each for explaining examples of the present invention, and a repeated explanation for each of the components will not be made.

EXAMPLE 1

Figure 5:
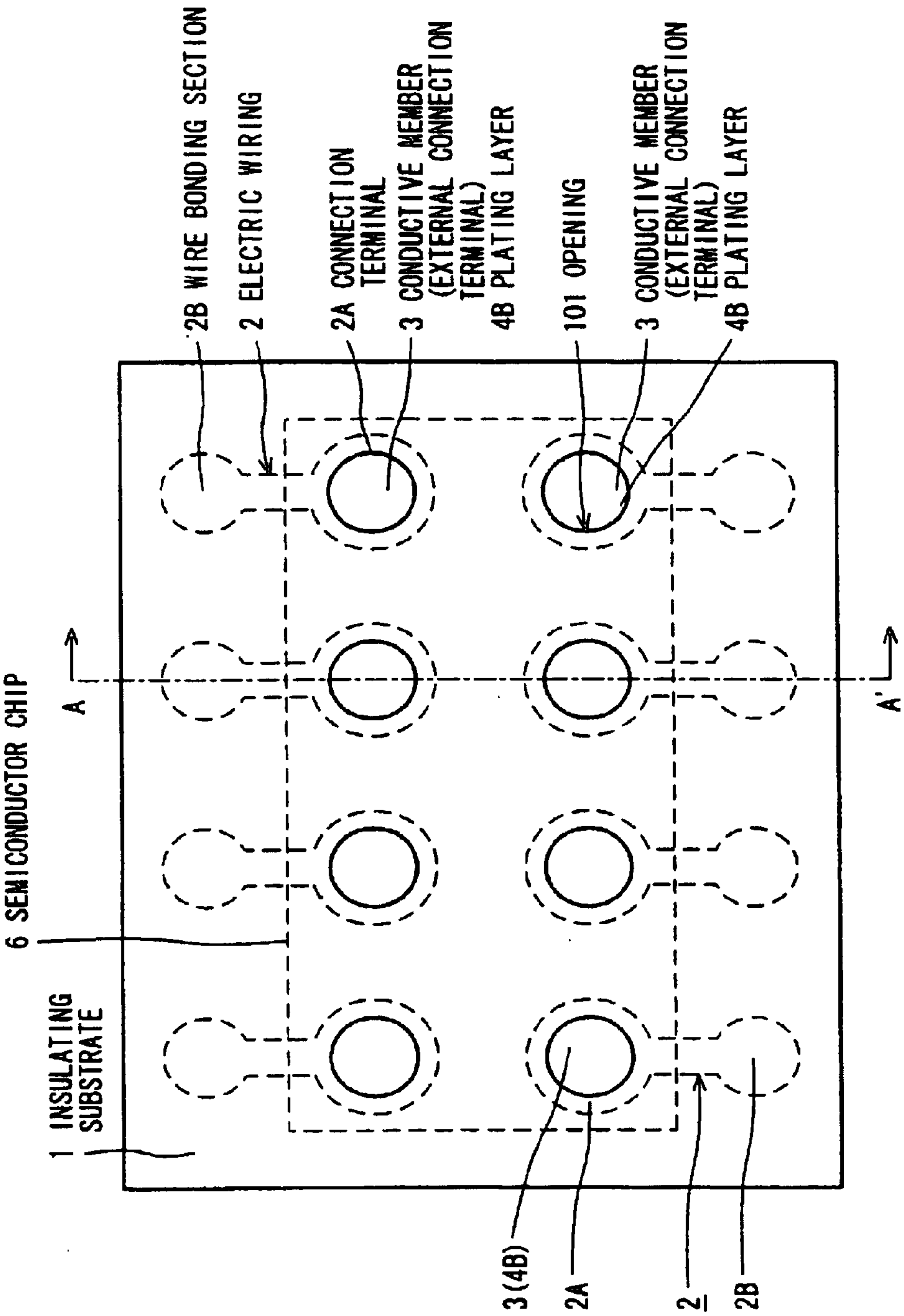
FIG. 5 is a schematic plan view showing an outlined constitution of a semiconductor device of Example 1 according to the present invention.
Figure 6:
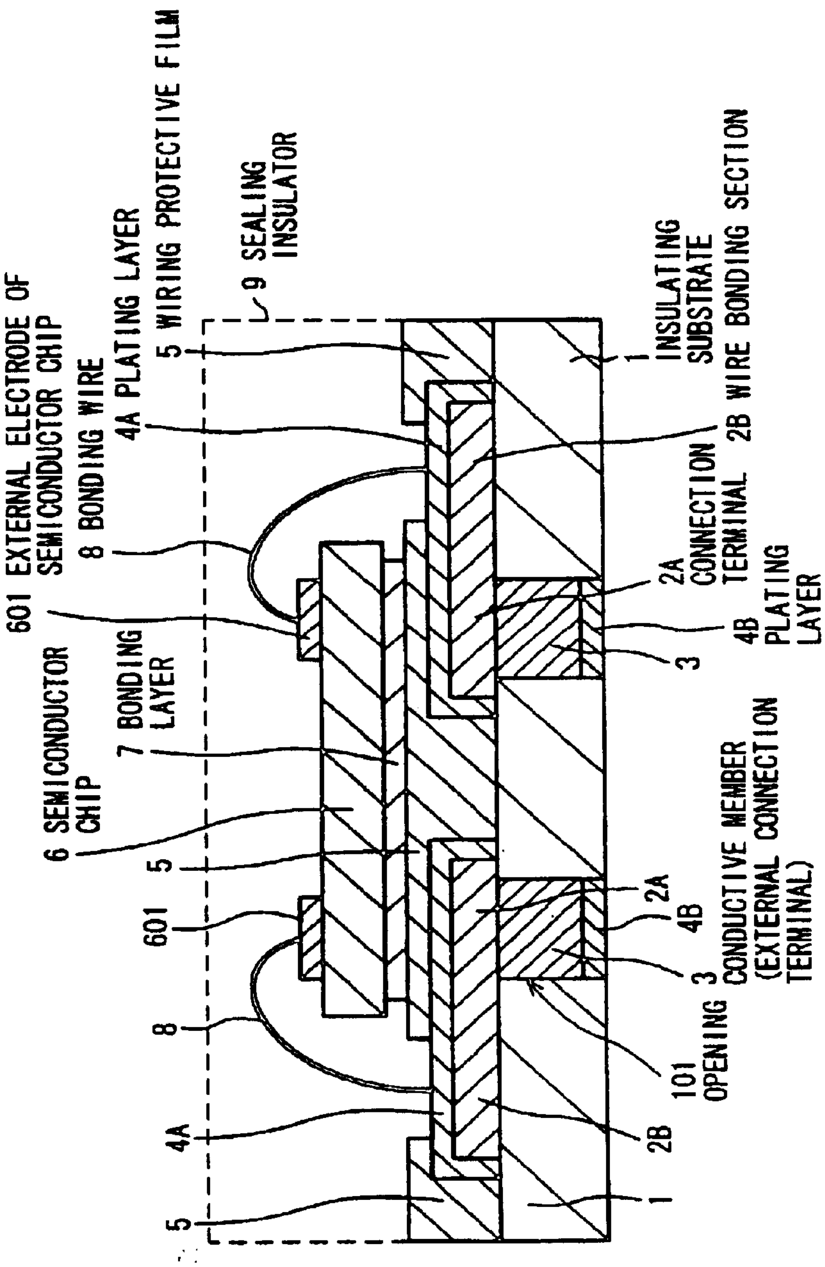
FIG. 6 is a schematic sectional view taken along the line A–A' of FIG. 5.

FIGS. 5 and 6 are schematic views each illustrating an outlined constitution of the semiconductor device of Example 1 according to the present invention wherein FIG. 5 is a schematic plan view showing the semiconductor device of Example 1 according to the present invention, and FIG. 6 is a sectional view taken along the line A–A' of FIG. 5.

In FIGS. 5 and 6, a reference character 1 designates an insulating substrate, 101 an opening, 2 an electric wiring, 2A a connection terminal, 2B a wire bonding section, 3 a conductive member (external connection terminal), 4A and 4B plating layers, 5 a wiring protective film, 6 a semiconductor chip, 601 an external electrode of the semiconductor chip, 7 a bonding layer, 8 a bonding wire, and 9 a sealing insulator, respectively.

A semiconductor device of Example 1 according to the present invention relates to the one of LGA type, as shown in FIGS. 5 and 6, which is composed of a wiring board that is prepared by such a manner that an opening 101 is defined at a predetermined position of the film-like insulating material 1, the electric wiring 2 involving the connection terminal 2A covering around the opening 101 is disposed on a principal plane of the insulating substrate 1, the interior of the opening 101 is filled with the conductive member 3, the plating layer 4A is disposed on the surface of the electric wiring 2, the plating layer 4B is disposed on the surface of the conductive member 3, and the wiring protective film 5 is disposed in such that a predetermined position of the electric wiring 2 (wire bonding section 2B) is opened; the semiconductor 6 that is placed through the bonding layer 7 on the surface on which the electric wiring 2 of the wiring substrate (insulating substrate 1) has been formed; the bonding wire 8 for connecting the external electrode 601 of the semiconductor chip 6 with the wire bonding section 2B of the electric wiring 2; and the sealing insulator 9 for sealing the semiconductor chip 6, the bonding wire 8, and a connecting section for the wire bonding section 2B and the bonding wire 8. Furthermore, the semiconductor chip 6 is disposed, as shown in FIG. 6, in such that a surface opposed to that on which the external electrode has been disposed is opposed to that on which the external electrode has been disposed is opposed to the wiring substrate.

The conductive member 3 is used for an external connection terminal in case of connecting the above-described semiconductor device with a mount board such as a mother board or an external device, and it is made of, for example, copper (Cu), nickel (Ni), silver (Ag) or the like. Moreover, the conductive member 3 is disposed as shown in FIG. 6 in such that a thickness defined from a surface on which an electric wiring of the insulating substrate 1 has been formed is thinner than that of the insulating substrate 1, and the plating layer 4B formed on a surface of the conductive member 3 does not protrude from the surface opposed to the surface on which the electric wiring of the insulating substrate 1 has been formed.

Furthermore, the plating layer 4A to be formed on a surface of the electric wire 2 and the plating layer 4B to be formed on a surface of the conductive member 3 are prepared by laminating a nickel (Ni) plating layer and a gold (Au) plating layer, respectively.

Figure 7A:
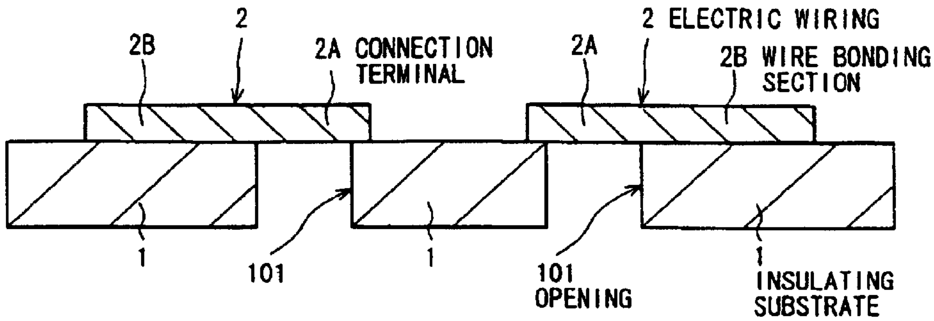
FIGS 7A, 7B, and 7C are schematic sectional views each explaining for a process for the production of the semiconductor device of the Example 1 wherein they are schematic sectional views illustrating respective manufacturing steps of a wiring board.
Figure 7B:
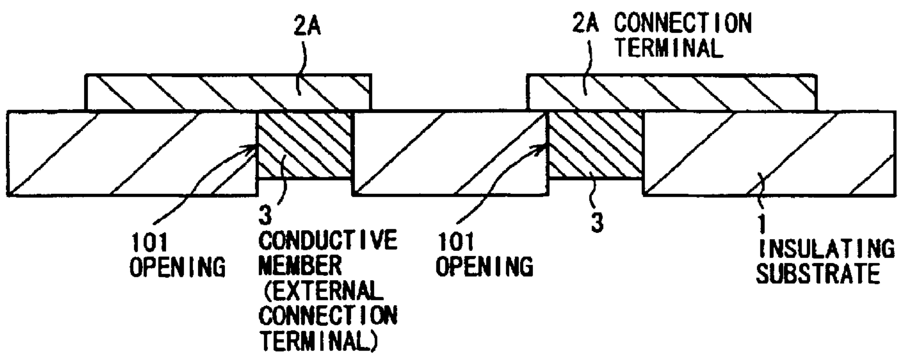
Figure 7C:
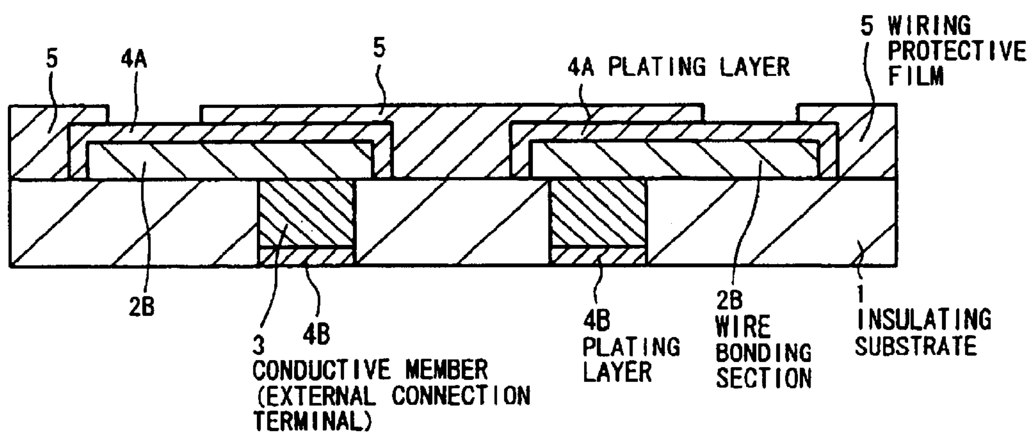
Figure 8:
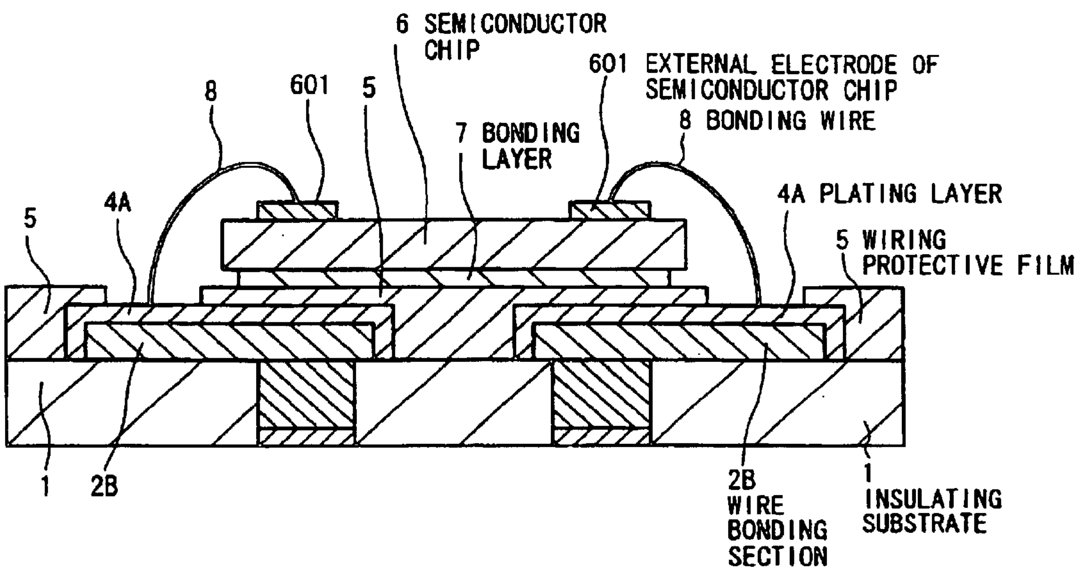
FIG. 8 is a schematic sectional view for explaining a process for the production of the semiconductor device of the Example 1 according to the present invention.

FIGS. 7A, 7B, and 7C as well as FIG. 8 are schematic views each explaining for a process for the production of a semiconductor device of Example 1 according to the present invention wherein FIGS. 7A, 7B and 7C are schematic sectional views each of them illustrates a step for producing a writing substrate used for the semiconductor device of the present Example 1, and FIG. 8 is a schematic sectional view in a manufacturing step of a semiconductor device. In this case, it is to be noted that each sectional view of FIGS. 7A, 7B, and 7C as well as of FIG. 8 corresponds to the section taken along the line A–A' of FIG. 5.

First, a conductive thin film made of copper or the like is formed on a principal plane of the insulating substrate 1 made of a polyimide tape or the above-described insulating substrate 1 by means of laser and the like, and then, the above-described conductive thin film is etched to form the electric wiring 2 provided with the connection terminal 2A covering the above-described opening 101 as shown in FIGS. 5 and 7A. Besides, the wire bonding section 2B for connecting a bonding wire is formed on an end of the electric wiring 2 as shown in FIG. 5. There is, however, a case where no wire binding section 2B is formed. Since the conductive member 3, which is used as an external connection terminal for connecting with an external device, is formed in the opening 101, it is opened with a size of, for example, around 200 $\mu$m to 500 $\mu$m diameter.

Furthermore, a manner for forming the opening 101 and the electric wiring 2 is not limited to the procedure described above, but, for example, it may be in such that a bonding layer (not shown) is formed on a principal plane of the above-described insulating substrate 1, the opening 101 is defined by punching with the use of a metal mold on the insulating substrate 1 and the bonding layer at a predetermined position, thereafter, a conductive thin film such as a copper foil is bonded to the insulating substrate 1 by means of the above-described bonding layer, and the conductive thin film is etched to form the above-described electric wiring 2.

Then, the conductive member 3 is formed inside the above-described opening 101 by the use of a copper electroplating method. In this case, a thickness of the conductive member 3 is formed in such that it is thicker than a half (½) of that of the above-described insulating substrate. Moreover, a manner for producing the conductive member 3 is not limited to a copper plating in accordance with a copper electroplating method, but, for example, a nickel (Ni) plating is applicable in accordance with electroplating, electroless plating and the like methods, or a conductive member may be formed in such that an electrically conducting paste such as a silver (Ag) paste, and a copper (Cu) paste is printed inside the opening 101 or applied thereto, thereafter, it is heated to solidify the same.

Then, the plating layer 4A on a surface of the electric wiring 2 and the plating layer 4B on a surface of the conductive member 3 are formed, and the wiring protective film 5 wherein a periphery of the wire bonding section 2B to which a bonding wire of the electric wiring 2 is to be connected has been opened is formed on the surface on which the electric wiring 2 of the insulating substrate 1 has been formed as shown in FIG. 7C. The above-described plating layers 4A and 4B are prepared in accordance with such a manner that a nickel plating layer having a thickness of about 1 μm is formed by means of, for example, electroplating method or electroless plating method, and then, a gold plating layer having a thickness of about 0.5 μm is formed by means of electroless plating method. Furthermore, the above-described wiring protective film 5 is formed by means of, for example, solder resist or photosolder resist.

In accordance with the procedure as described above, a wiring board used for a semiconductor device of the present Example 1 can be obtained.

Next, a semiconductor chip 6 is bonded to the surface on which the electric wiring 2 of a wiring board produced in accordance with the procedure as described above has been applied by means of a bonding layer 7. In this case, the semiconductor chip 6 is bonded in accordance with faceup mounting, in other words, the plane opposed to that on which an external electrode 601 has been formed is bonded so as to oppose to the above-described wiring board. Then, the external electrode 601 of the semiconductor chip 6 is connected with the wire bonding section 2B of the electric wiring 2 by means of the bonding wire 8.

Thereafter, the semiconductor chip 6, the bonding wire 8, and a connecting section of the electric wiring 2 and the bonding wire 8 on the insulating substrate 1 are sealed with a sealing insulator 9 such as an epoxy-based thermosetting resin, and then the insulating substrate is cut off at a predetermined position, so that a semiconductor device of LGA type as shown in FIGS. 5 and 6 can be obtained.

A semiconductor device produced in accordance with the procedure as described above is the one of LGA type wherein the conductive member 3 formed inside the opening 101 of the above-described insulating substrate 1 may be used as an external connection terminal for connecting a mount board such as a mother board, or an external device. Therefore, the semiconductor device can be thinner by an amount corresponding to a height of a ball terminal than of a conventional semiconductor of CSP type.

Figure 9:
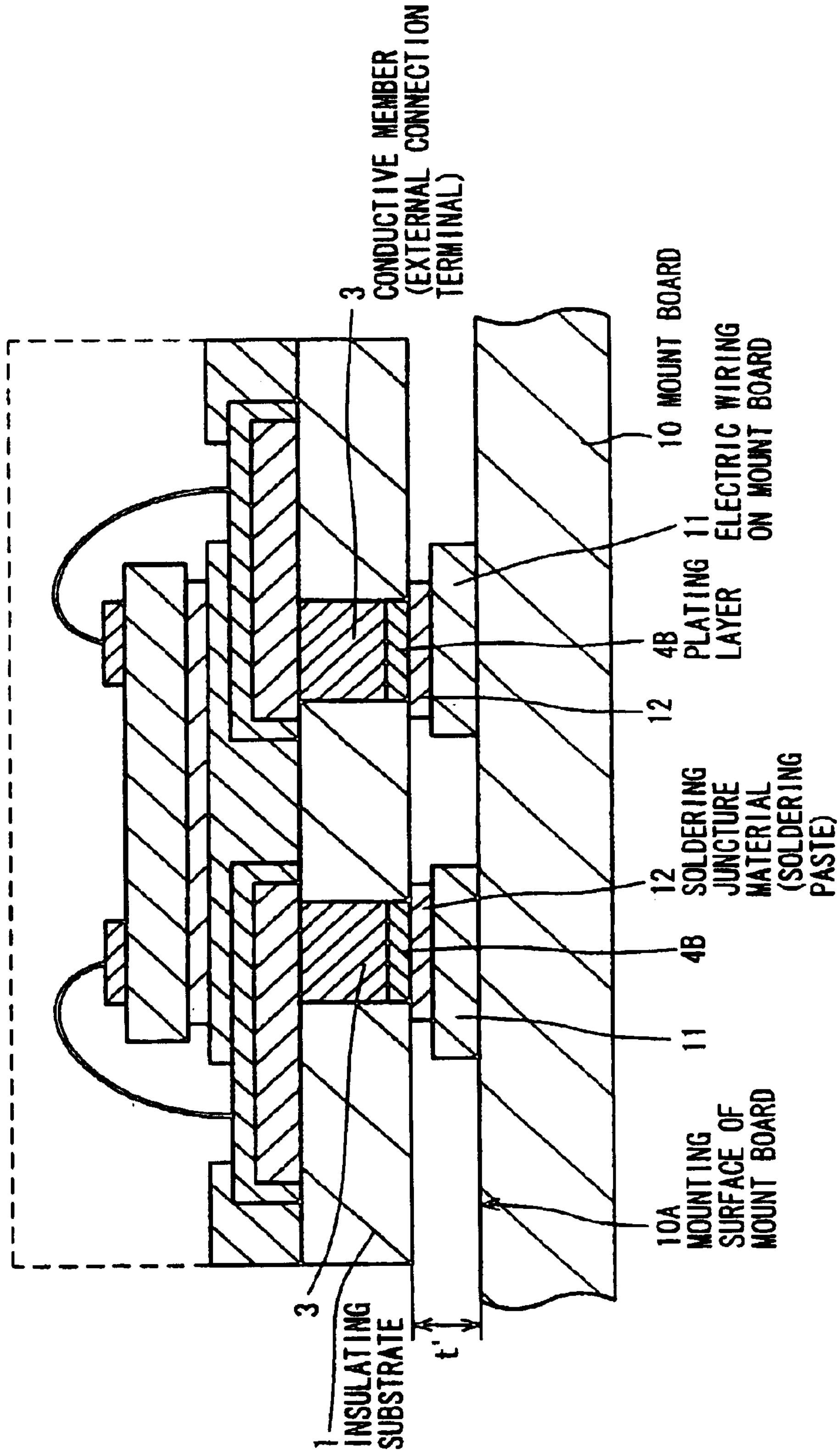
FIG. 9 is a schematic view illustrating an appearance wherein the semiconductor device of the Example 1 according to the present invention is mounted on a mount board.

FIG. 9 is a schematic sectional view showing an appearance wherein a semiconductor device of the present Example 1 is mounted on a mount board in which a reference numeral 10 designates a mount board, 11 an electric wiring on the mount board, and 12 a soldering paste, respectively.

In the case when a semiconductor device produced in accordance with the procedure described above is mounted on the mount board 10, a conductive paste such as the soldering paste 12 is either applied or printed on the electric wiring 11 disposed on the mount board 10, the electric wiring 11 is aligned with the conductive member 3 of the semiconductor device and they are mounted, thereafter the soldering paste 12 is heated and solidified, whereby a connection is completed as shown in FIG. 9. In this case, since the conductive member 3 does not protrude from the insulating substrate 1, a height extending from a mounting surface 10A to the insulating substrate 1 in the case where the above-described semiconductor device was mounted can be made lower than that of a conventional semiconductor device of CSP type wherein a connection is made by the use of a ball terminal.

As described above, according to the Example 1, the opening 101 is defined at a predetermined positioned of the insulating substrate 1, and the conductive member 3 is formed inside the opening 101 by means of a plating method or the like, whereby the conductive member 3 may be used as an external connection terminal for connecting a mount board or an external device. As a result, a semiconductor device can be thinner than that of a conventional semiconductor device of CSP type by an amount corresponding to a height of a ball terminal.

Furthermore, since the conductive number 3 inside the opening 101 of the insulating substrate 1 is used as an external connection terminal, a wiring board of the above-described semiconductor device of LGA type can be produced by the use of a copper foil single-sided tape material wherein a conductive thin film has been provided only on a single side of the insulating substrate 1. For this reason, its material cost becomes more inexpensive, besides its manufacturing steps become simpler than that of the case where a copper foil double-sided tape material wherein copper foils have been applied on both surfaces of the insulating substrate 1 as in a wiring bard which is to be used in a conventional semiconductor device of LGA type, so that its cost of manufacture for a wiring board to be used in the semiconductor device of LGA type can be reduced.

Figure 10:
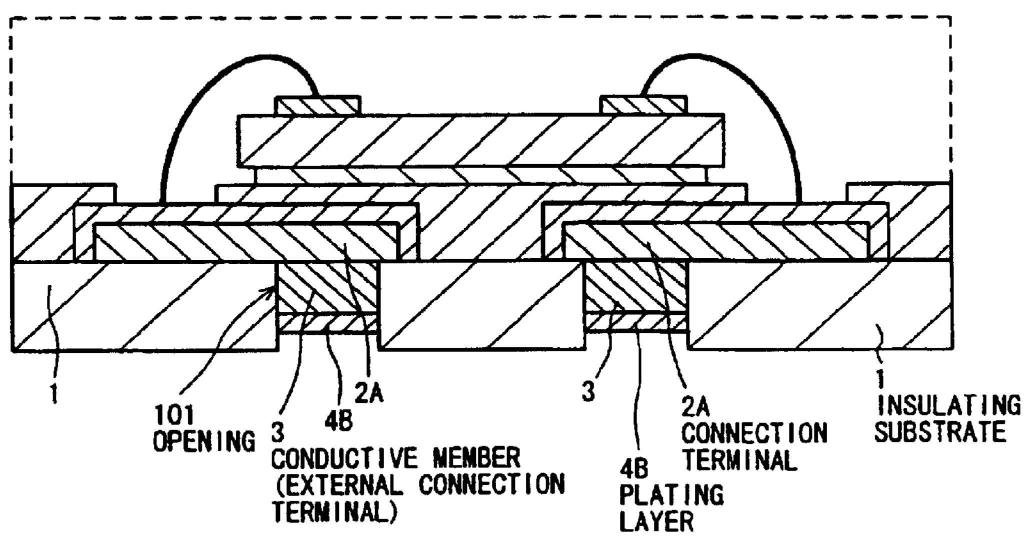
FIG. 10 is a schematic sectional view illustrating a modification of the semiconductor device of the Example 1.
Figure 11:
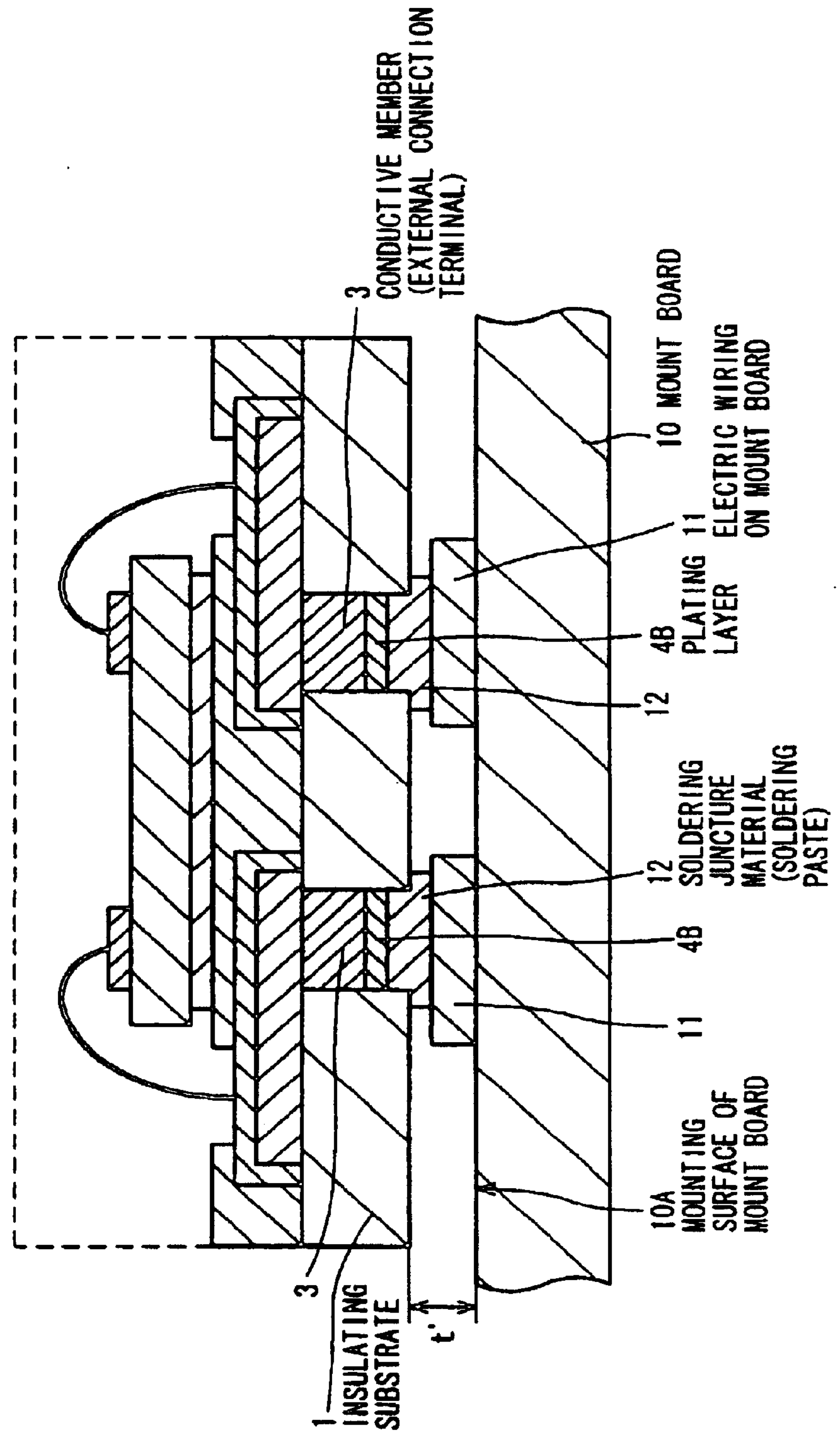
FIG. 11 is a schematic sectional view illustrating an appearance wherein the semiconductor device shown in FIG. 10 is mounted on a mount board.
Figure 12:
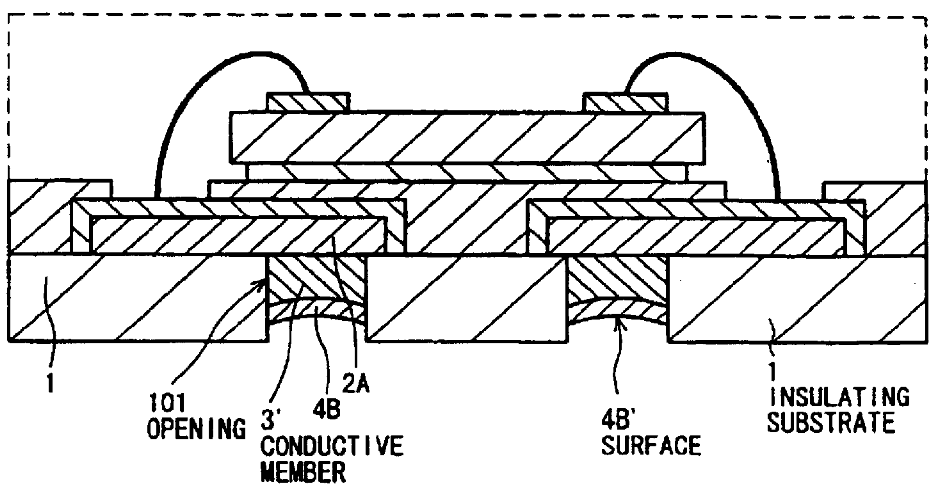
FIG. 12 is a schematic sectional view illustrating another modification of the semiconductor of the Example 1.

FIGS. 10, 11, and 12 are schematic sectional views each explaining for a modification of the semiconductor device of the Example 1 wherein FIG. 10 is a schematic sectional view illustrating an outlined structure of a semiconductor device, FIG. 11 is a schematic sectional view illustrating an appearance in which the semiconductor device of FIG. 10 has been mounted on a mount board, and FIG. 12 is a schematic sectional view illustrating an outlined structure of another modification of the semiconductor device.

In a semiconductor device of LGA type of the Example 1, although a thickness of the conductive member 3 disposed inside the opening 101 and the plating layer 4B applied on the bottom surface thereof in the above-described insulating substrate 1 has been equal to that of the insulating substrate 1 as shown in FIG. 6, the invention is not limited thereto, but a thickness of the conductive member 3 and the plating layer 4B applied on the bottom surface thereof may be thinner than that of the above-described insulating substrate 1 wherein a contour of the opening 101 may be concaved.

In the case where a semiconductor device in which a thickness of the conductive number 3 is thinner than that of the insulating substrate 1 as shown in FIG. 10 is mounted on a mount board 10, a part of a soldering paste 12 applied on an electric wiring 11 of the mount board 10 is soaked up into the opening 101 to be connected with the plating layer 4B as shown in FIG. 11. For this reason, a height extending from a mounting surface 10A of the mount board 10 to a wiring board (insulating substrate 1) can be made thinner in this case than that of the semiconductor device of the Example 1. Moreover, since a part of the soldering paste 12 has been soaked up in the opening 101, it may be considered that connection reliability with respect to a stress along a direction in horizontal plane of the mounting surface 10A of the mount board 10 is improved.

Furthermore, as result of making thinner a thickness of the conductive member 3 as shown in FIG. 10, for example, when the conductive member 3 is formed by means of a plating method, a plating growth time can be reduced, whereby a time for producing a wiring board can be shortened. In addition, since an amount required for producing a conductive material decreases, its material cost decreases also, so that its cost of manufacture can be reduced more than that of the case of the Example 1.

On one hand, when a surface of the conductive member 3 (plating layer 4B) is flat in the case where a thickness of the conductive member 3 is thinner than that of the insulating substrate 1, and the soldering paste 12 is soaked up in the opening 101 as shown in FIG. 10, air remains in a side wall section of the opening 101 to generate voids, and it results easily in a cause for poor connection. For this reason, when the conductive member 3' and a surface 4B' of the plating layer 4B are concaved as shown in FIG. 12, air in the opening 101 makes easily away outside the opening 101 along the surface 4B' of the conductive member 3', whereby poor connection due to voids can be reduced.

EXAMPLE 2

Figure 13:
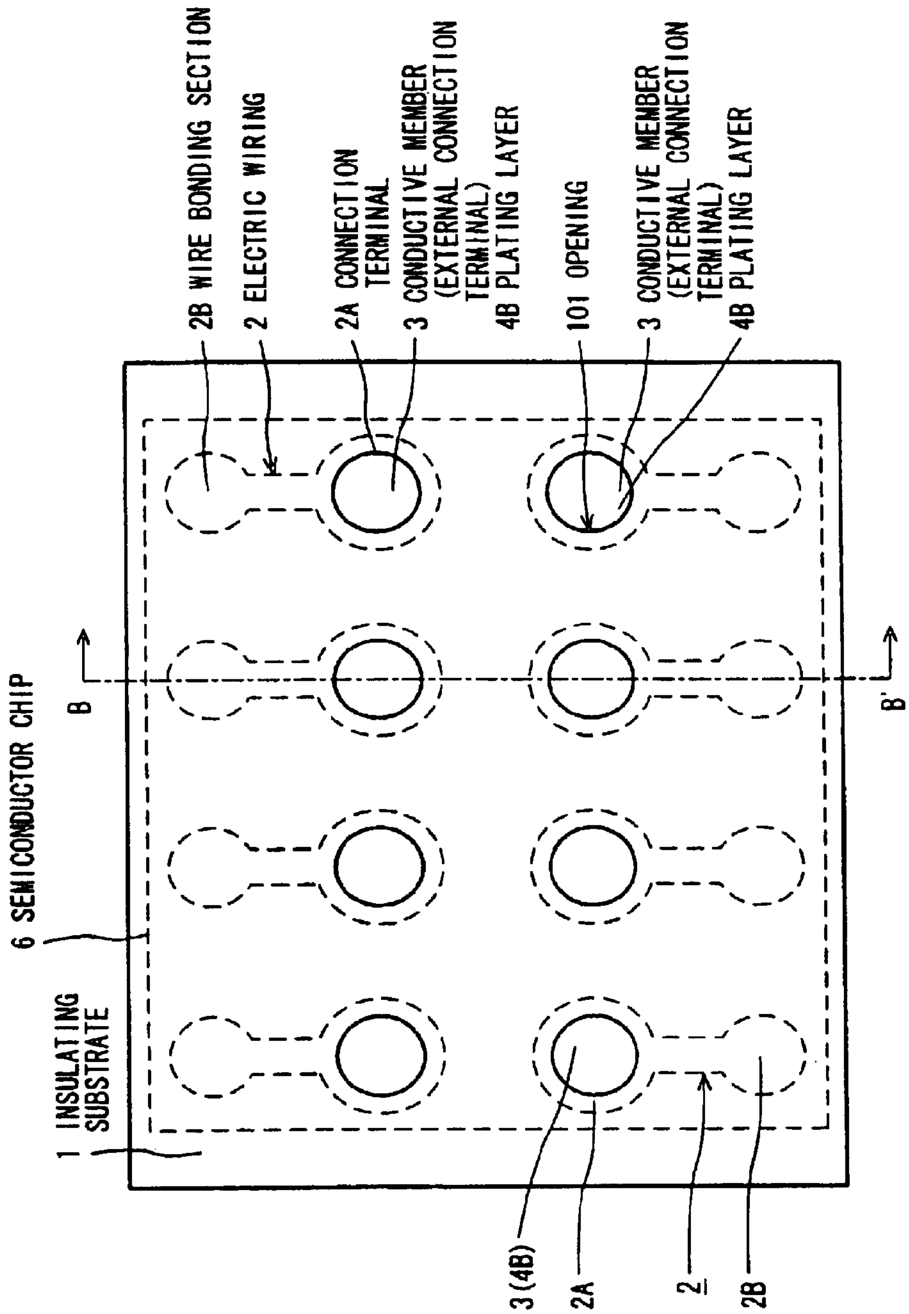
FIG. 13 is a schematic plan view showing an outlined constitution of a semiconductor device of Example 2 according to the present invention.
Figure 14:
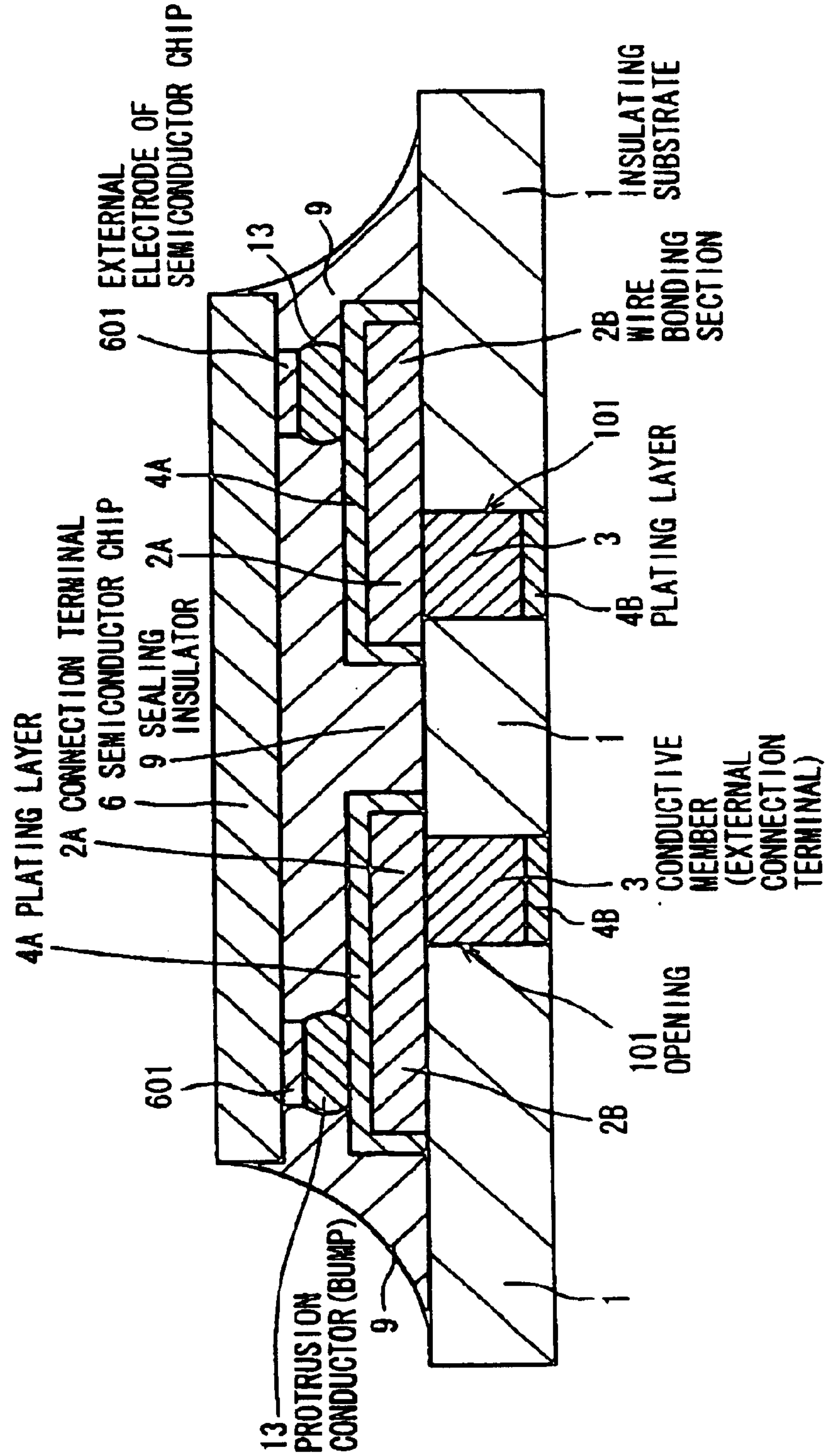
FIG. 14 is a schematic sectional view taken along the line B–B' of FIG. 13.

FIGS. 13 and 14 are schematic views each illustrating an outlined constituted of a semiconductor device of Example 2 according to the present invention wherein FIG. 13 is a schematic plan view showing a semiconductor device of the present Example 2, and FIG. 14 is a schematic sectional view taken along the line B—B of FIG. 13.

In FIGS. 13 and 14, reference numeral 1 designates an insulating substrate, 101 an opening, 2 an electric writing, 2A a connection terminal, 2B a wire bonding section, 3 a conductive member (external connection terminal), 4A and 4B plating layers, 6 a semiconductor chip, 601 an external electrode of the semiconductor member (external connection terminal), 4A and 4B plating layers, 6 a semiconductor chip, 601 an external electrode of the semiconductor chip, 9 a sealing insulator, and 13 a protrusion conductor (bump), respectively.

A semiconductor device according to the Example 2 is the one of LGA type, and the semiconductor device comprises, as shown in FIGS. 13 and 14, a wiring board wherein an opening 101 is defined at a predetermined position of a film-like insulating substrate 1, the electric wiring 2 provided with the connection terminal 2A for covering the opening 101 on a principal plane of the insulating substrate 1 is disposed, the inside of the opening is filled with the conductive member 3, the plating layer 4A is applied on a surface of the electric wiring 2, and the plating layer 4B is applied on a surface of the conductive member 3; the semiconductor chip 6 disposed on the surface on which the electric wiring 2 of the wiring board (insulating substrate 1) has been formed; the protrusion conductor (bump) 13 for connecting the external electrode 601 of the semiconductor chip 6 with the electric wiring 2; and the sealing insulator 9 for sealing the semiconductor chip 6, the protrusion conductor 13, and a connecting section of the electric wiring 2 with the protrusion conductor 13. Furthermore, the semiconductor chip 6 is arranged in such that the surface on which the external electrode 601 has been disposed is opposed to the wiring board as shown in FIG. 14.

The above-described conductive member 3 is used as an external connection terminal in the case where the semiconductor device is connected with a mount board such as a motherboard, or an external device. The conductive member 3 is made of, for example, copper (Cu), nickel (Ni), silver (Ag) or the like. Moreover, a thickness of the conductive member 3 extending from the surface on which the electric wiring of the insulating substrate 1 has been formed is made to be thinner than that of the insulating substrate 1, and in addition, the plating layer 4B to be applied to a surface of the conductive member 3 is disposed so as not to protrude the surface opposed to that of the insulating substrate 1 on which the electric wiring has been formed as shown in FIG. 14.

Moreover, the plating layer 4A to be applied to a surface of the electric wiring 2 and the plating layer 4B to be applied to a surface of the conductive member 3 are prepared by laminating a nickel (Ni) plating layer and a gold (Au) plating layer, respectively.

A wiring board used for a semiconductor device of the present Example 2 is produced in accordance with the same procedure in the process for the production of wiring board mentioned in the above-described Example 1, and accordingly, the explanation therefor will be omitted.

After forming a wiring board in accordance with the same procedure as described in the Example 1, the semiconductor chip 6 is disposed on the surface on which the electric wiring 2 of the insulating substrate 1 (wiring bard) has been formed, the external electrode 601 of the semiconductor chip 6 is positioned in such that it is opposed to the electric wiring 2, and the external electrode 601 is connected with the electric wiring 2 by means of the protrusion conductor 13 made of, for example, a gold bump or the like. The above-described protrusion conductor 13 may have been formed either on the external electrode 601 of the semiconductor chip 6, or on the above-described electric wiring 2.

After the semiconductor chip 6 was subjected to flip-chip mounting on the wiring board, a sealing insulator made of a liquid resin such as an epoxy-based thermosetting resin is poured in between the above-described wiring board and the semiconductor chip to cure the resin to seal these parts, and the insulating substrate 1 is cut off at a predetermined position, whereby the semiconductor device as shown in FIGS. 13 and 14 can be obtained.

Figure 15:
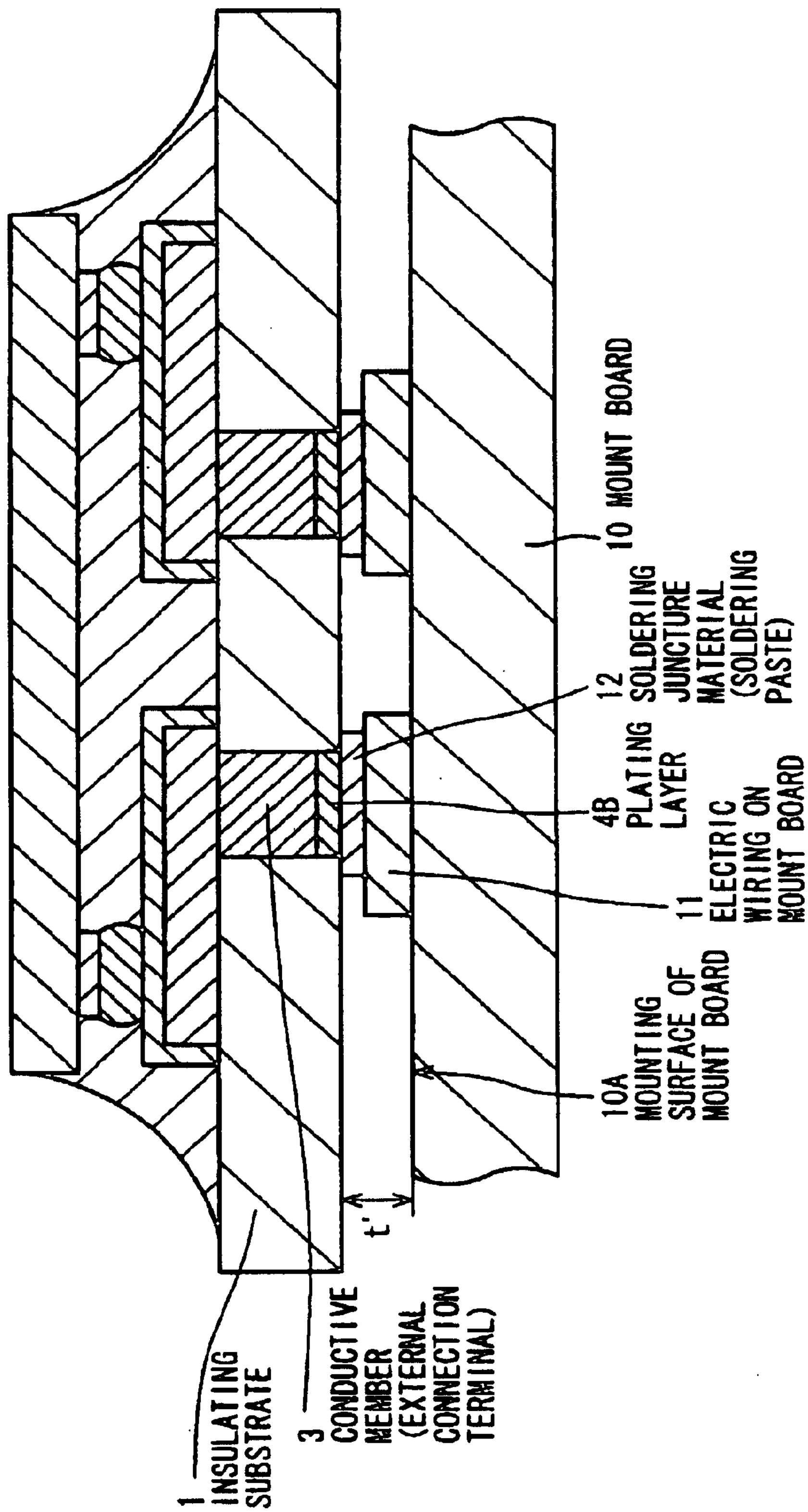
FIG. 15 is a schematic sectional view illustrating an appearance wherein the semiconductor device of the Example 2 according to the present invention is mounted on a mount board.

FIG. 15 is a schematic sectional view illustrating an example wherein the semiconductor device of the present Example 2 has been mounted on a mount board.

In the case when a semiconductor device produced in accordance with the procedure described above is mounted on a mount board 10, a conductive paste such as soldering paste 12 is either applied or printed on electric wiring 11 disposed on the mount board 10, the electric wiring 11 disposed on the mount board 3 of the semiconductor device and they are mounted, thereafter the soldering paste 12 is heated and solidified, whereby a connection is completed as shown in FIG. 15. In this case, since the conductive member 3 does not protrude from the insulating substrate 1, a height extending from a mounting surface 10A to the insulating substrate 1 in the case where the above-described semiconductor device was mounted can be made lower than that of a conventional semiconductor device of CSP type wherein a connection is made by the use of a ball terminal. As a result, a mounted height of a semiconductor device can be reduced in the case where the semiconductor device was thinned and mounted.

As described above, according to the Example 2, the opening 101 is defined at a predetermined position of the insulating substrate 1, and the conductive member 3 is formed inside the opening 101 by means of a plating method or the like, whereby the conductive member 3 may be used as an external connection terminal for connecting a mount board or an external device. As a result, a semiconductor device can be thinner than that of a conventional semiconductor device of CSP type by an amount corresponding to a height of a ball terminal.

Furthermore, since the conductive member 3 inside the opening 101 of the insulating substrate 1 is used as an external connection terminal, a wiring board of the above-described semiconductor device of LGA type can be produced by the use of a copper foil single-sided tape material wherein a conductive thin film has been provided only on a single side of the insulating substrate 1. For this reason, its material cost becomes more inexpensive, besides its manufacturing steps become simpler than that of the case where a copper foil double-sided tape material wherein copper foils have been applied on both surfaces of the insulating substrate 1 as in a wiring board, which is to be used in a conventional semiconductor device of LGA type, so that its cost of manufacture for a wiring board to be used in the semiconductor device of LGA type can be reduced.

Figure 16:
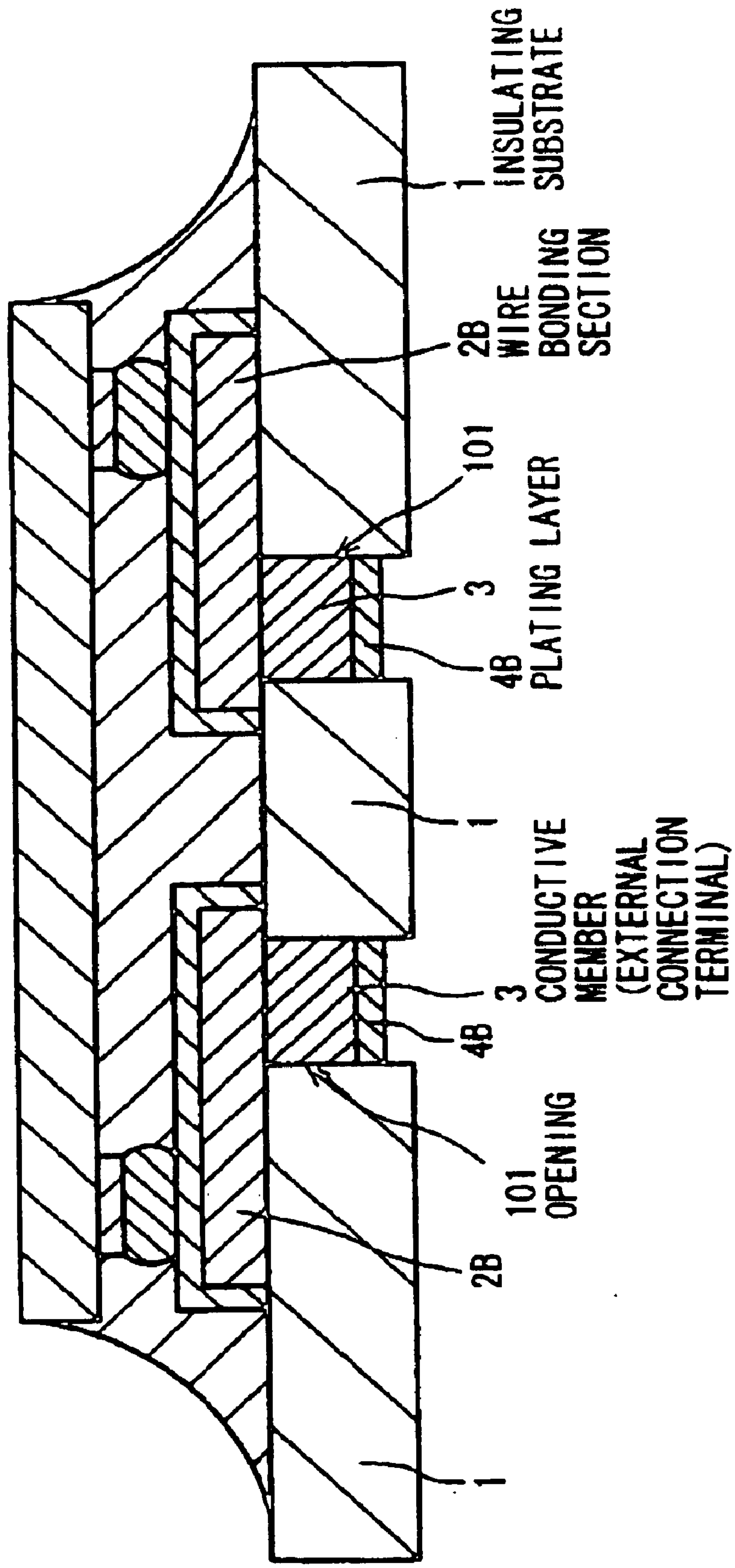
FIG. 16 is a schematic sectional view illustrating a modification of the semiconductor device of the Example 2.
Figure 17:
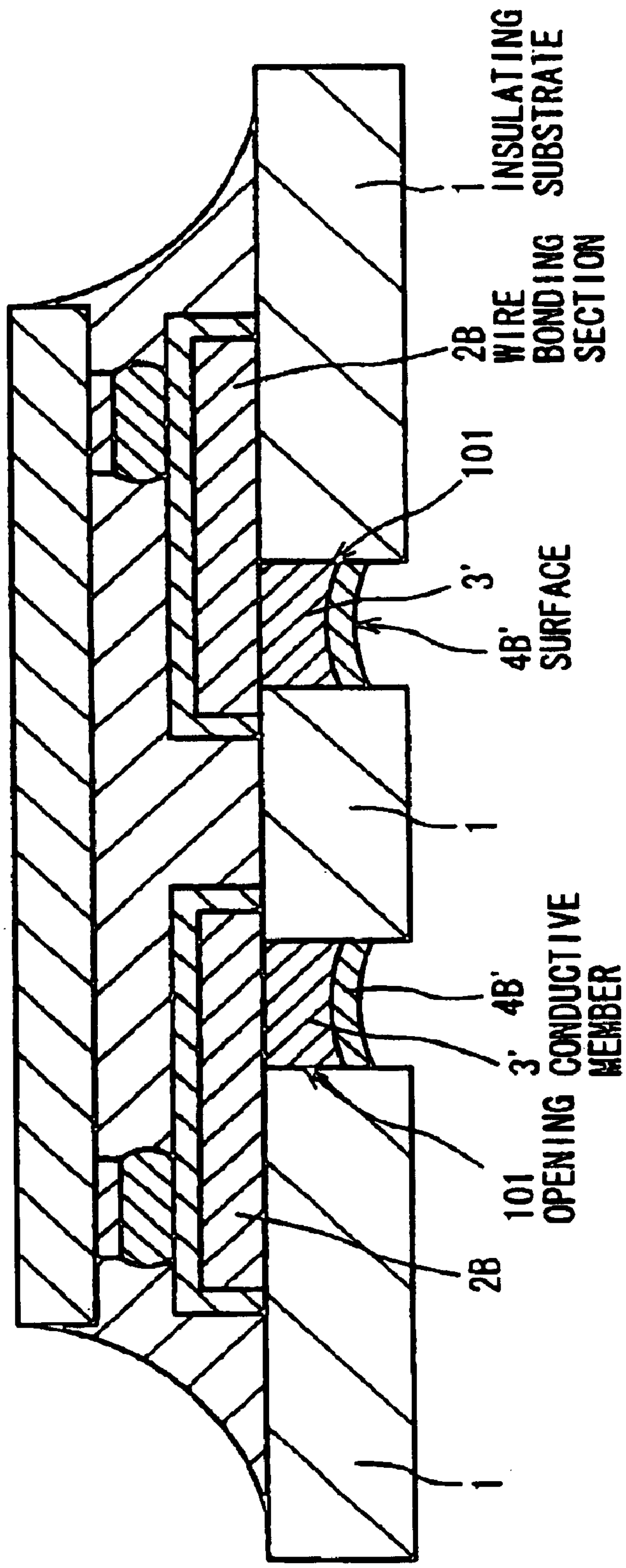
FIG. 17 is a schematic sectional view illustrating another modification of the semiconductor device of the Example 2.
Figure 18:
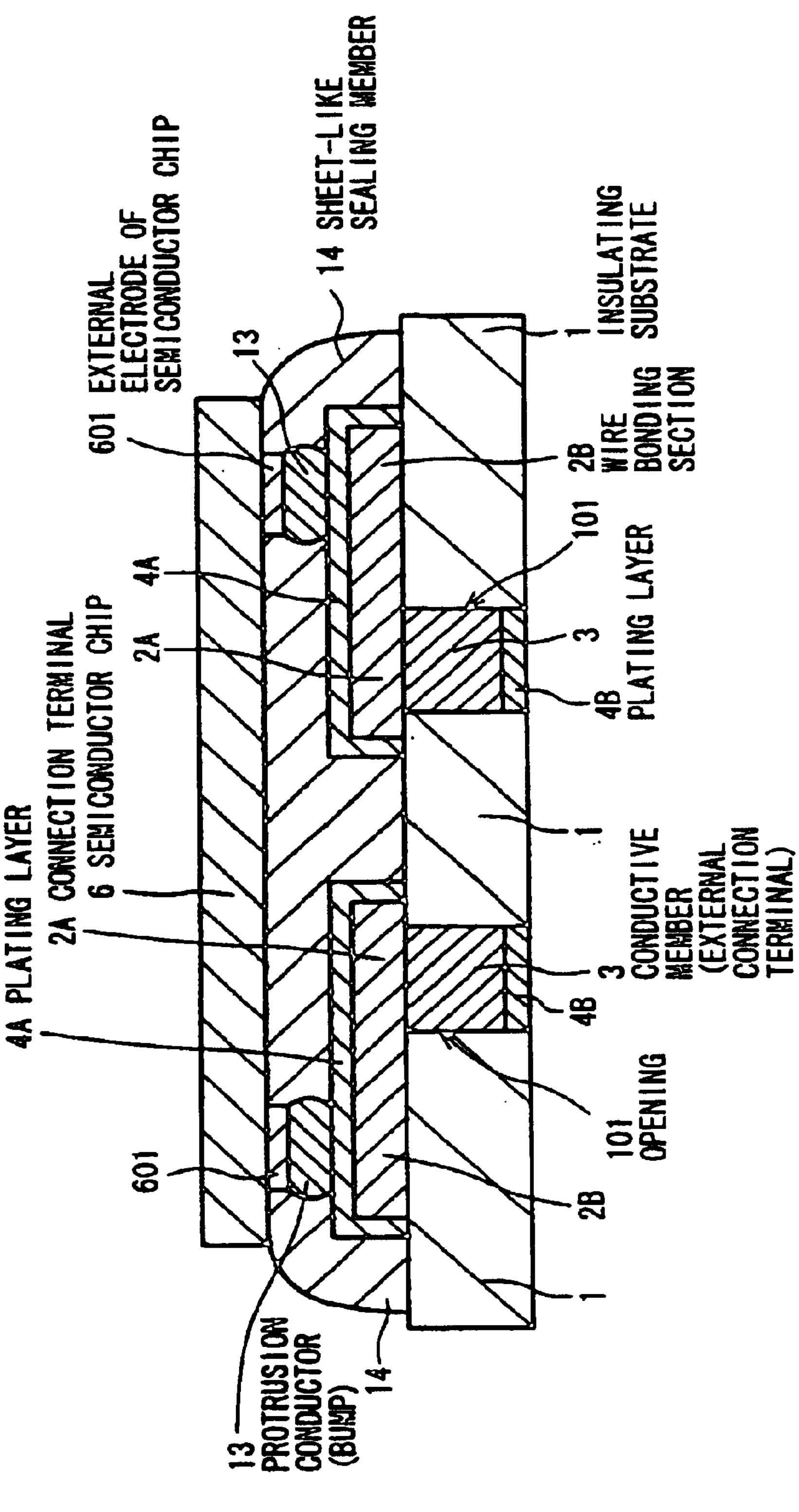
FIG. 18 is a schematic sectional view illustrating a further modification of the semiconductor device of the Example 2.

FIGS. 16, 17, and 18 are schematic sectional views each explaining for a modification of the semiconductor device of the Example 1 wherein FIG. 16 is a schematic sectional view illustrating an outlined structure of a semiconductor device, FIG. 17, and FIG. 18 are a schematic sectional views each illustrating an outlined structure of another modification of the semiconductor device.

In a semiconductor device of LGA type of the Example 1, although a thickness of the semiconductor member 3 disposed inside the opening 101 and the plating layer 4B applied on the bottom surface thereof in the above-described insulating substrate 1 has been equal to that of the insulating substrate 1 as shown in FIG. 14, the invention is not limited thereto, but a thickness of a conductive member 3 and the plating layer 4B applied on the bottom surface thereof may be thinner than that of the above-described insulating substrate 1 wherein a contour of the opening 101 may be concaved.

In the case where a semiconductor device in which a thickness of the conductive member 3 is thinner than that of the insulating substrate 1 as shown in FIG. 16 is mounted on a mount board 10, a part of a soldering paste 12 applied on an electric wiring 11 of the mount board 10 is soaked up into the opening 101. For this reason, a height extending from a mounting surface 10A of the mount board 10 to a wiring board (insulating substrate 1) can be made thinner than that of the semiconductor device of the Example 1. Moreover, since a part of the soldering paste 12 has been soaked up in the opening 101, it may be considered that connection reliability with respect to a stress along a direction in a horizontal plane of the mounting surface 10A of the mount board 10 is improved.

Furthermore, as a result of making thinner a thickness of the conductive member 3 as shown in FIG. 12, for example, when the conductive member 3 is formed by means of a plating method, a plating growth time can be reduced, whereby a time for producing a wiring board can be shortened. In addition, since an amount required for producing a conductive material decreases, its material cost decreases also, so that its cost of manufacture can be reduced more than that of the case of the Example 2.

On one hand, when a surface of the conductive member 3 (plating layer 4B is flat in the case where a thickness of the conductive member 3 is made thinner than that of the insulating substrate 1, and the soldering paste 12 is soaked up in the opening 101 as shown in FIG. 12, air remains in a side wall section of the opening 101 to generate voids, and it results easily in a cause for poor connection. For this reason, when the conductive member 3 and a surface 4B' of the plating layer 4B are concaved as shown in FIG. 17, air in the opening 101 makes easily away outside the opening 101 along the surface of the conductive member 3, whereby poor connection due to voids can be reduced.

In the semiconductor device of the above-described Example 2, although the sealing insulator 9 has been poured in between the wiring substrate (insulating substrate 1) and the semiconductor chip 6 to seal these components after the subjecting the semiconductor chip 6 to flip-chip junction, the present invention is not limited thereto, but a seat-like sealing material 14 such as NCF and ACF was formed on the wiring board, and then, such a semiconductor chip 6 wherein a protrusion conductor 13 such as a stud bump has been formed on the above-described external electrode 601 may be subjected to flip-chip junction as shown in, for example, FIG. 18. In this case, the protrusion conductor 13 thrusts away sealing material 11, whereby the protrusion conductor 13 is connected with the electric wiring 2, and at the same time, the semiconductor chip 6 is bonded to the wiring substrate (insulating substrate 1).

While the present invention has been specifically described on the basis of the examples described above, the invention is not limited thereto, but various modifications may be, of course, applicable so far as it does not depart from the subject matter of the invention.

Advantageous effects obtained by the typical inventions disclosed in the specification will be simply described hereinafter.

1. Since a ball terminal, which is to be used in a semiconductor device of CSP type, or an external connection terminal (land) which is to be used in a semiconductor device of LGA type, is not employed in the present invention, there is no need for considering a contacting condition between ball terminals or a contacting condition between external connection terminals (lands). Accordingly, a spacing defined between via holes may be narrowed, so that a package can be downsized.

2. A semiconductor device wherein a semiconductor chip has been mounted on a wiring board can be thinned.

3. A height extending from a mount board to the top of a semiconductor device wherein a semiconductor chip has been mounted on a wiring board can be reduced in the case when the semiconductor device is mounted on the mount board.

4. Manufacturing steps of a wiring board, which are to be applied for a semiconductor device of LGA type, can be simplified to reduce its cost of manufacture.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A process for the production of a wiring board, comprising the steps of:

defining an opening at a predetermined position of a film-like insulating substrate;

forming a conductive thin film on a first principal surface of said insulating substrate;

etching said conductive thin film to form an electric wiring provided with a connection terminal covering said opening;

forming, in said opening, a conductive member that is connected to said connection terminal; and forming sequentially a thin film layer made of nickel (Ni) and a thin film layer made of gold (Au) on the surfaces of said conductive member, wherein said conductive member does not protrude from a second principal surface of said insulating substrate opposed to said first principal surface and has a thickness thinner than that of said insulating substrate, and said thin film layer made of gold does not protrude from said second principal surface.

2. A process for the production of a wiring board as claimed in claim 1, wherein:

a step for forming said conductive member is effected by forming a copper (Cu) plating or a nickel (Ni) plating in accordance with an electroplating method.

3. A process for the production of a wiring board as claimed in claim 1, wherein:

a step for forming said conductive member is effected by forming a nickel (Ni) plating in accordance with an electroless plating method.

4. A process for the production of a wiring board as claimed in claim 1, wherein:

a step for forming said conductive member is effected by such a manner that the inside of said opening is filled with a conductive paste of silver (Ag) or copper (Cu), and said conductive paste is solidified.

5. A process for the production of a wiring board as claimed in claim 1, wherein:

a step for forming said conductive member is effected by such a manner that said conductive member has a thinner thickness at the central portion of said opening than that of a vicinity of a side wall of said opening.

* * * * *